United States Patent [19]

Rydel

[11] Patent Number: 5,450,038
[45] Date of Patent: Sep. 12, 1995

[54] INTERMEDIATE FREQUENCY AMPLIFIER AND A TELECOMMAND SIGNAL RECEIVER HAVING SUCH AN AMPLIFIER

[75] Inventor: Charles Rydel, Paris, France

[73] Assignee: Valeo Electronique, Cedex, France

[21] Appl. No.: 213,171

[22] Filed: Mar. 14, 1994

[30] Foreign Application Priority Data

Mar. 19, 1993 [FR] France .................. 93 03191

[51] Int. Cl.⁶ ................... H03F 3/68; H03G 3/30
[52] U.S. Cl. .................. 330/310; 330/278; 330/165
[58] Field of Search ........... 330/165, 278, 289, 297, 330/302, 310, 311

[56] References Cited

U.S. PATENT DOCUMENTS 2,994,833  8/1961  Cerofolini .................... 330/311
3,566,293  2/1971  Von Recklinghausen ......... 330/266
4,435,686  3/1984  Griffith ........................ 330/311

FOREIGN PATENT DOCUMENTS 2072979 10/1981 United Kingdom .

Primary Examiner—Steven Mottola
Attorney, Agent, or Firm—Morgan & Finnegan

[57] ABSTRACT

An electronic device, for example a signal receiver mounted on a vehicle for opening and closing the doors of the vehicle in response to telecontrol signals from a remote source, includes an intermediate frequency amplifier. The intermediate frequency amplifier comprises two amplifier stages arranged in cascade with respect to the input signal, with the biasing terminals of the two stages being connected in series across the supply. The arrangement gives much reduced current consumption.

5 Claims, 4 Drawing Sheets

INTERMEDIATE FREQUENCY AMPLIFIER AND A TELECOMMAND SIGNAL RECEIVER HAVING SUCH AN AMPLIFIER

FIELD OF THE INVENTION

The present invention relates to an intermediate frequency amplifier of low current consumption, and to an on-board signal receiver, for example carried by a vehicle, the said receiver having such an amplifier. A receiver of this kind may for example comprise a telecontrol receiver such as may be arranged for opening the doors of a vehicle in response to command (control) signals received from a remote transmitting device.

BACKGROUND OF THE INVENTION

It has previously been proposed in the prior art to make use of angular modulation, for example frequency modulation, in the transmission of digital information to a means for processing that information. When the processing means comprises an on-board module which is arranged to receive signals from a radio frequency telecontrol device, i.e. a remote radio transmitting device, for commanding the opening or closing of the doors of a vehicle, the relatively high current consumption of the on-board module presents major problems. In this connection, the on-board module has to remain on alert all the time, so that it can shift into its active mode at any time, on reception of a suitable radio frequency signal.

The device located at the input of the on-board module has to be capable of amplifying the signals received on a receiving antenna, the gain of which is necessarily limited because of the small amount of space which is available for it.

In addition, the transmitting device is located in a portable key carried by the user of the vehicle, and this key includes an emitter the output signal power of which is itself very weak, because the transmitting device also has to include an energy source, an electronic generating circuit, and a transmission antenna, all in a very small format. This format may be for example similar to that of a credit card, or it may be contained in the head of a mechanical key associated with the anti-theft system of a motor vehicle.

The input stage of the on-board module must therefore consist of a very high performance electronic circuit, the current consumption of which must, on the other hand, be as small as possible.

Circuits having low current consumption do of course exist per se. However, their selectivity is correspondingly reduced, which makes them unsuitable for overcoming the above mentioned problem.

In addition, it is known to provide an input device of the intermediate frequency kind, but this has to have at least two stages in order to effect both the selection and the decoding of the modulation received from the transmitting device. As a result, the current consumption of such an input device is high, because it is necessary to polarise two successive stages.

In a co-pending patent application, the present Applicants have proposed an arrangement, having a plurality of stages, for an input device in which electrical current consumption is considerably reduced.

DISCUSSION OF THE INVENTION

The present invention is directed to the adaptation of such an arrangement to an intermediate frequency amplifier having reduced current consumption. This intermediate frequency amplifier is characterised in that it includes at least two stages which are connected in series with the electrical supply, and has its input terminals connected in cascade.

According to the invention in a first aspect, an intermediate frequency amplifier is characterised in that it includes a first amplifying transistor and a second amplifying transistor, the collector-emitter paths of which are connected in series, between two supply lines of high potential and low potential, to respective windings of two transformers, which are matched in such a way that the input signal passes in cascade through the base of the first transistor, its collector, the transformer, the base of the second transistor and its collector, to the output of the amplifier, while the biasing means for the first and second transistors are in series with each other.

According to the invention in a second aspect, a signal receiver, for example one for receiving telecontrol signals, being typically (though not exclusively) arranged to be mounted on a vehicle, includes at least one intermediate frequency amplifier in accordance with the said first aspect of the invention.

Further features and advantages of the present invention will appear more clearly on a reading of the detailed description, which follows, of preferred embodiments of the invention, given by way of example only and with reference to the accompanying drawings.

DESCRIPTION OF PREFERRED EMBODIMENTS OF THE INVENTION

Figure 1:
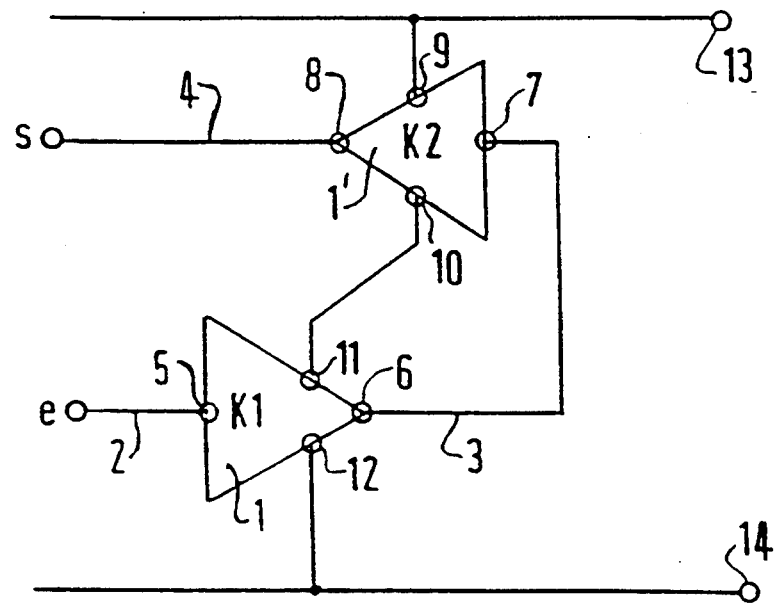
FIG. 1 is a diagram showing in general terms a device for reducing electrical consumption, adapted to an intermediate frequency amplifier in accordance with the present invention.

FIG. 1 is a diagram which shows in general terms a device for reducing electrical consumption, which is adapted to an intermediate frequency amplifier in accordance with the present invention.

The main elements of this device are a first stage 1 and a second stage 1', each of which has a signal input terminal, 5 and 7 respectively, and a signal output terminal 6 and 8 respectively, together with direct current supply terminals 9 and 11 respectively for high or positive potential, and direct current supply terminals 10 and 12 respectively for low or negative potential.

The signal input terminal of the device itself, indicated by the reference e, is connected through a line 2 to the signal input terminal 5 of the first stage 1. The signal output terminal 6 of the first stage 1 is connected through a line 3 to the signal input terminal 7 of the second stage 1'. The signal output terminal 8 of the second stage 1' is connected through a line 4 to the signal output terminal s of the device itself.

In this arrangement, although the stages 1 and 1' are (from the point of view of the signal received at e) connected in cascade, the stages 1 and 1' are connected in series between a first, high or positive potential, supply terminal 13 of the device and a second, low or negative potential, supply terminal 14 of the device. With this in view, the second stage 1' is connected through its positive supply terminal 9 to the high or positive potential supply terminal 13 of the device; similarly, the negative, or zero potential, supply terminal 10 of the second stage 1' is connected to the positive supply terminal 11 of the first stage 1. The negative supply terminal 12 of the first stage 1 is connected to the low potential or negative supply terminal 14 of the device itself.

If the equivalent supply resistances, for example in the absence of any signal, in the electronic device shown are respectively R1 between the terminals 11 and 12 for the first stage 1, and R2 between the terminals 9 and 10 for the second stage 1', then if Ua is the direct current supply voltage across the supply terminals 13 and 14 of the device, it will be noted that the power consumed may be expressed as $$P = U_a^2/(R1 + R2)$$

In accordance with the teachings of the prior art, it is seen that the positive supply terminals 11 and 9 of the first and second stages 1 and 1' respectively will both be connected to the positive supply 13, while the respective negative supply terminals 12 and 10 of the two stages will be connected in common to the negative supply 14 of the device. In that case, the power consumed will be increased, and can be expressed as $$P = U_a^2/R1 + U_a^2/R2.$$

In the arrangements according to the present invention described in this specification, the number of stages can be increased, provided that the voltage difference between the terminals which are at the highest d.c. voltage and those at the lowest d.c. voltage is large enough, in respect to each stage, to permit suitable polarisation of the device.

In the device shown in FIG. 1, the output signal produced may be expressed as $S(p) = K1 \times K2 \, E(p)$, if K1 and K2 are the respective transfer functions of the stages 1 and 1', and E(p) and S(p) are the Laplace transforms of the input signal e and output signal s of the device as a whole.

The device shown in FIG. 1 is used when the stages 1 and 1' are in the form of amplifiers.

Figure 2:
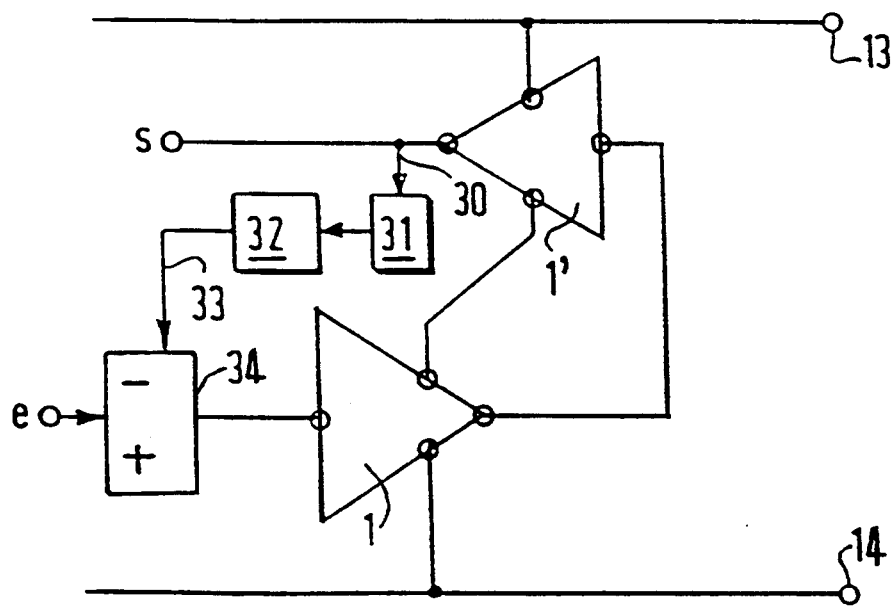
FIG. 2 is a diagram which shows a supplementary means for making an electrical correction in the device of FIG. 1.

Reference is now made to FIG. 2, which shows a supplementary means which is adapted for use with the device shown in FIG. 1. In this arrangement, the stages 1 and 1' are taken to be voltage amplifiers. They are connected as shown in FIG. 1, and their connection to the d.c. supply will not be described any further. Automatic gain correction (AGC) can be obtained using the arrangement shown in FIG. 3, by detecting, via a connection 30, the output signal s at the output of the second stage 1'.

In FIG. 2, the supplementary means referred to above comprises a detector circuit 31, the output signal from which controls a signal generator 32 of the automatic gain correcting means. The signal generator 32 is connected through a line 33 to an adding element 34 on the signal input path e. The input signal e is for example passed to a positive input terminal (indicated at +) in FIG. 2, of the adder 34, while the output signal from the automatic gain correcting means is connected to a negative input terminal, indicated at "−" in FIG. 2, of the adder 34. In the particular embodiment shown in FIG. 3 (to which further reference will be made below), automatic gain correction works in a negative mode. It should be noted that the automatic gain correction can be applied over only part of the waveband of the output signal s, by putting a band pass filter on the line 30.

Figure 3:
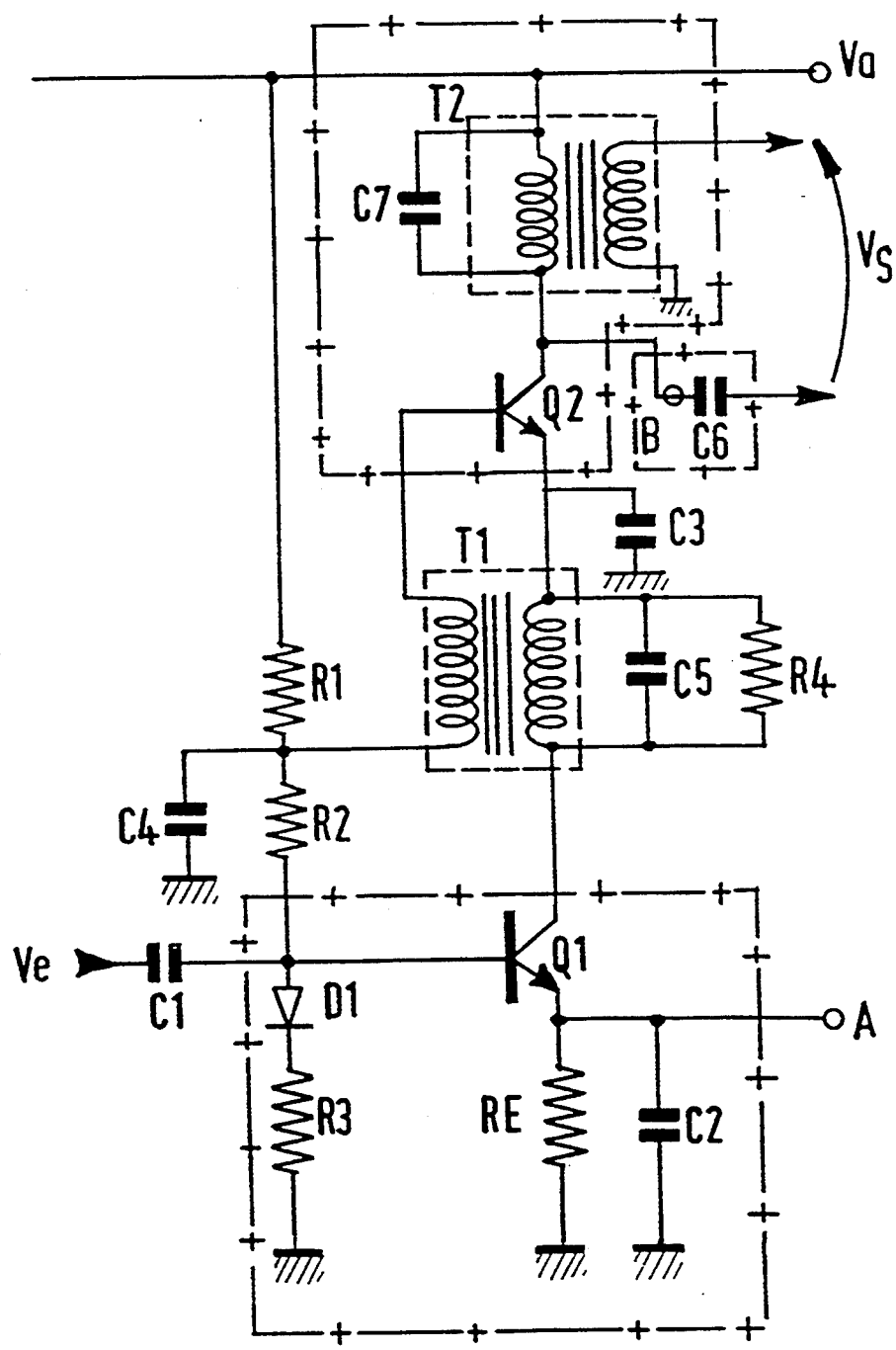
FIG. 3 is a circuit diagram of an intermediate frequency amplifier in accordance with the invention.

Reference is now made to the circuit diagram of FIG. 3, which shows an intermediate frequency amplifier which applies the principle described in general terms above with reference to FIG. 1. Such an amplifier must be permanently supplied in such a way that it can always receive the input signal, Ve, which is transmitted through a coupling capacitor C1, which cuts the d.c. component, to a first amplifying stage comprising a transistor Q1 of the NPN type, and a second amplifying stage comprising a transistor Q2 of the NPN type. The emitter of the transistor Q1 is connected to ground (earth) through a decoupling network comprising a resistor RE which is connected in parallel with the capacitor C2. The base of the transistor Q1 is biasing via the high voltage or positive supply line Va, in series across a polarising resistor R1, a biasing means for the base of the second stage amplifier transistor Q2, and a second biasing resistor R2, which is again connected to the base of the transistor Q1. Biasing is completed by a compensating diode D1 which is connected in series with a resistor R3 for adjusting the base-emitter voltage Vbe of the transistor Q1, connected to ground and acting as the low voltage or zero voltage supply line.

With this circuit, since the transistors Q1 and Q2 are substantially identical, they take the same current, and each of these transistors uses one half of the available supply voltage.

The resistors R1, R2 and R3 set the potentials on the bases of the transistors Q1 and Q2, and thus the potentials on their emitters. Under these circumstances, the voltage Ve1 across the resistor RE is expressed (ignoring base current) by:

$$Ve = Va \times R3/(R1 + R2 + R3) - Vbe,$$

while the current passing through the transistors Q1 and Q2 is equal to Ve1/RE. The transistor Q1 is therefore a current generator for the transistor Q2.

The emitter of the transistor Q2 is connected to the collector of the transistor Q1 through the secondary circuit of a transformer T1, comprising the secondary winding of the transformer T1, and through the capacitor C5 and a resistor R4 connected in parallel with each other.

The voltage on the emitter of the transistor Q2 is expressed by:

$$Ve2 = Va(R2 + R3)/(R1 + R2 + R3) - Vbe.$$

This voltage supplies the transistor Q1 through the transformer T1. Therefore, the transistor Q2 constitutes a voltage generator having a low output resistance Ro (Q2), which is equal to:

$$Ro(Q1) = 1/K2 \cdot Ic(Q2),$$

where K2 is the gain of the transistor Q2, and Ic(Q2) is the current passing through the transistor Q2. This gives:

$$Ic(Q2)=Ic(Q1)=Ve/RE.$$

As a result, the transistor Q1 works as a current source, while the transistor Q2 working as a voltage source, supplies the transistor Q1.

The primary of the transformer T1 has a first terminal which is connected to the common point between the biasing resistors R1 and R2, and a second terminal which is connected to the base of the transistor Q2.

In addition, the collector of the transistor Q2 is connected through a second transformer T2 to the high voltage supply line Va. The primary of the transformer T2 is connected in parallel with a capacitor C7, while the low voltage side of the primary is connected to the collector of the transistor Q2. The output signal of the intermediate frequency amplifier is taken at B from the collector of the transistor Q2. The secondary of the transformer T2 has a first terminal which is connected to ground, and a second terminal which acts as a floating earth or ground at the output voltage Vs of the intermediate frequency amplifier. The signal thus passes from the signal input Ve to the signal output B through the base of transistor Q1, the collector of transistor Q1, the transformer T1, the base of the transistor Q2, and the collector of transistor Q2.

In order that the intermediate frequency amplifier shall have sufficiently good selectivity, the transformers T1 and T2 are suitably matched in accordance with the desired signal wavebands and the desired curves or transfer functions.

From the point of view of the frequency of the signal Ve introduced on the input of the amplifier in FIG. 3, the transistor Q1 sees a supply source Q2 which is decoupled by the capacitor C3. In order to obtain this feature, the capacity of the capacitor C2 is so chosen that at the selected intermediate frequency it has an impedance much lower than the output impedance of the transistor Q2.

As will have been seen from the foregoing, the signals which are amplified by the transistor Q1 are coupled to the transistor Q2 through the secondary of the transformer T1, one end of which is connected to ground from the high frequency point of view, through the capacitor C4.

Since the emitter and base of the transistor Q2 are both connected to ground, it follows that the voltage on the secondary of the transformer T1 is applied between the base and the emitter of the transistor Q2. This voltage is amplified by the transistor Q2. According to circumstances, it can be taken either from a capacitive coupling of the collector of the transistor Q2, or from the secondary of the transformer T2.

Figure 4:
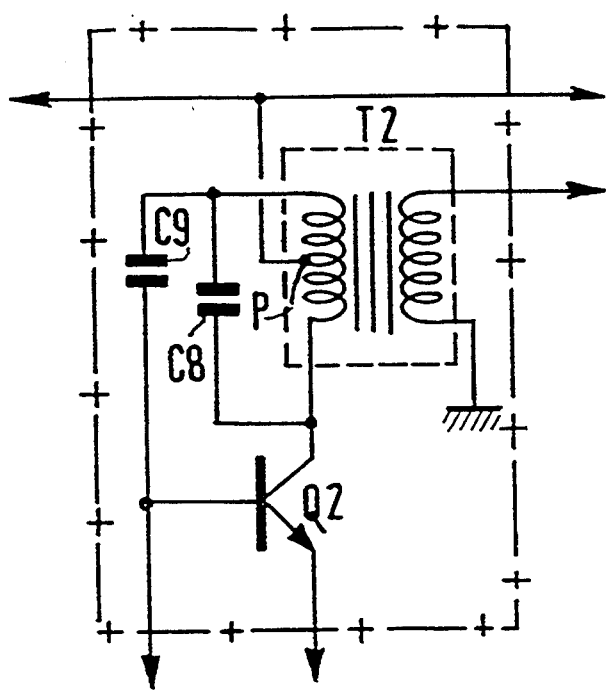
FIG. 4 shows a second embodiment of the parts of the circuit of FIG. 3.

Reference is now made to FIG. 4 which shows a modified embodiment, by way of a diagram in which the transformer T2 has been neutrodyned. Neutrodyne, in radio, is a high frequency amplifying circuit that has a small condenser to neutralize the instability between the input and output circuits. In this circuit, the primary of the transformer T2 has a mid-point tapping P which is connected to the positive potential supply line through a direct link. The two terminals of the primary winding are connected in parallel with a first capacitor C8. A first terminal of the primary winding is connected to the base of the transistor Q2 through a capacitor C9, while its other terminal is connected to the collector of the transistor Q2.

The circuit also has, across the secondary of the transformer T1 a resistor R4 which serves to damp this transformer, so that by suitably offsetting the match between the transformers T1 and T2, it is possible to obtain a flat waveband response having a predetermined waveform. It is also possible to select the resistance of the resistor R4 to be such that the group propagation time is constant.

In FIG. 3, the diode D1 provides temperature compensation for the base-emitter junction of the transistor Q1. This prevents the temperature of heat dissipation from being high.

Figure 5:
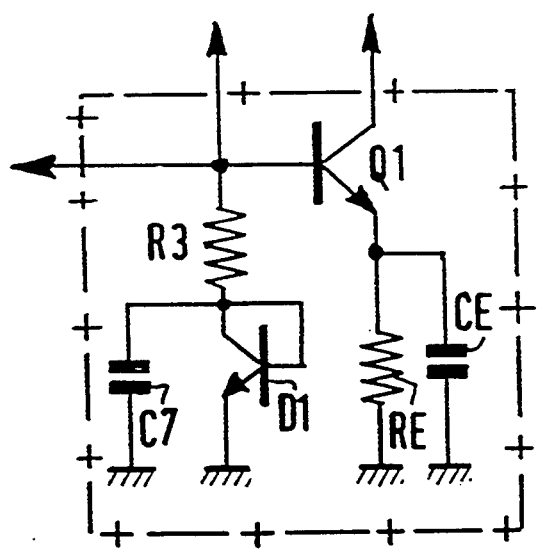
FIG. 5 shows a third embodiment of the parts of the circuit of FIG. 3.

Reference is now made to FIG. 5, which shows a modification of the circuitry for the transistor Q1 with temperature compensation. In this example, the diode D1 consists of a further transistor, which is identical to the transistor Q1, with the base and collector of the latter being short circuited. A capacitor C7 is connected in parallel with the collector-emitter path of the diode D1. The emitter and one end of the capacitor C7 are connected to ground. The collector of the diode D1 is connected to the base of the transistor Q1 through the biasing resistor R3.

Figure 6:
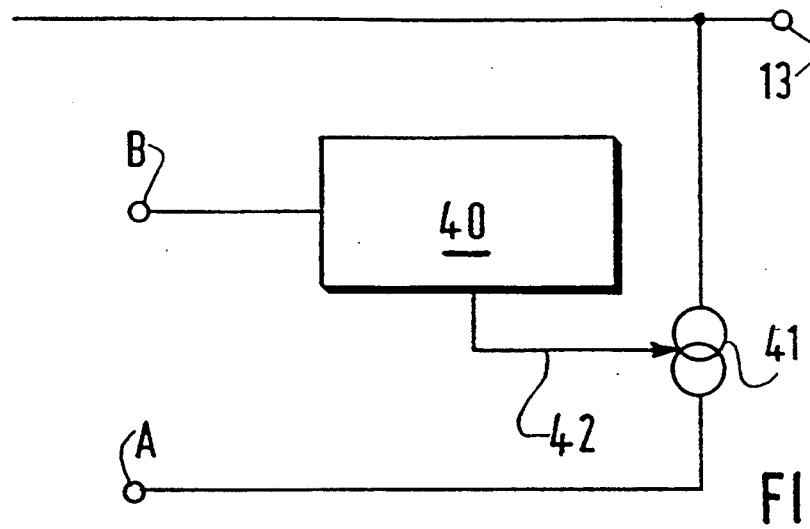
FIG. 6 is a diagram illustrating the principle of automatic correction, as it is applicable to the amplifier in FIG. 4.

Reference is now made to FIG. 6. This shows a further arrangement which enables automatic gain correction (AGC) to be obtained in the intermediate frequency amplifier. In the circuit shown in FIG. 3, it is sufficient to reduce the current in the transistor Q1 in order to correspondingly reduce the current in the transistor Q2.

The current variation is obtained by means of a level detecting means 40, which receives the output signal taken from the output means B in FIG. 3, and which produces a detection output signal 42. This output signal 42 controls a current source 41. The current source 41 is connected between the high potential (or positive) supply line 13 (see FIG. 1) and the summation point A of the currents on the transistor Q1. When it is desired to make an automatic gain correction using the circuit of FIG. 6, it is merely necessary to increase, to a greater or lesser extent, the amount of current taken from the supply, and thus to increase the potential Ve. Then, since the voltage Vb remains fixed, collector current is reduced in the transistor Q1 and therefore in the transistor Q2.

Figure 7:
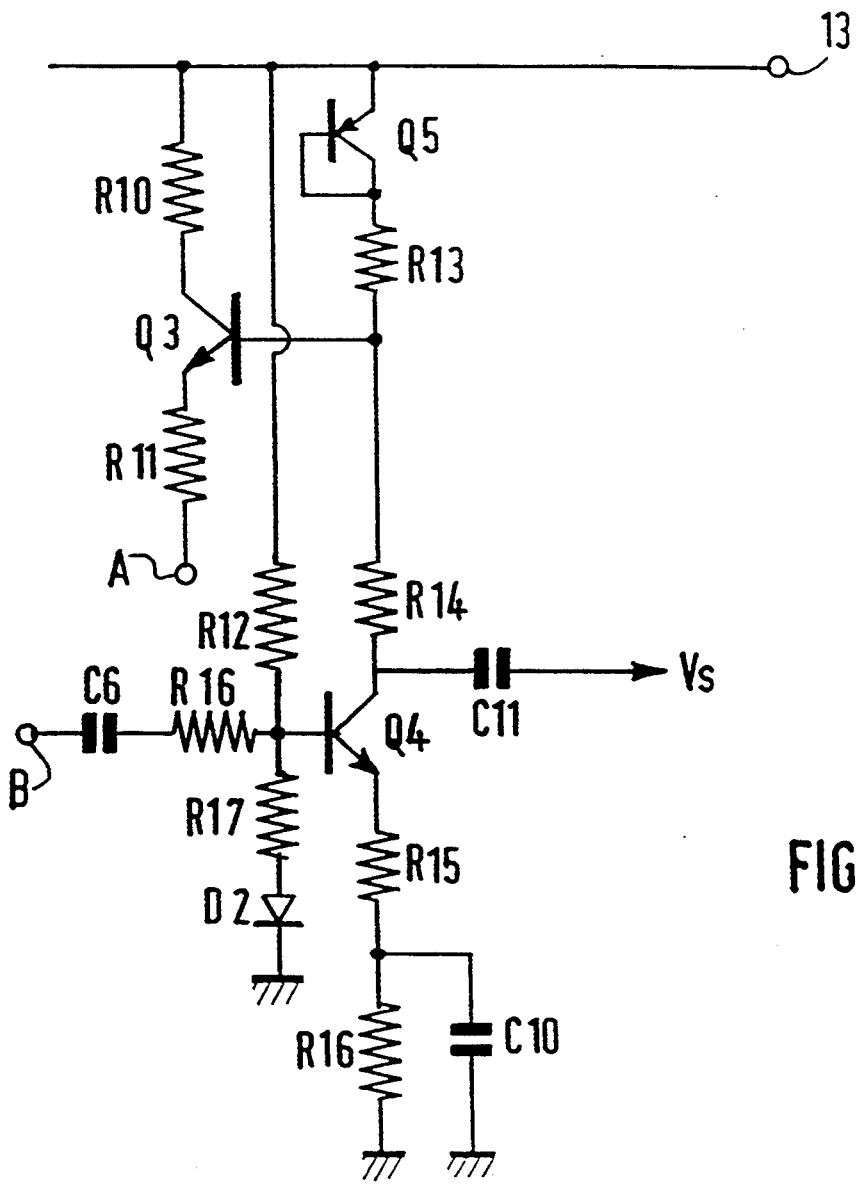
FIG. 7 is a circuit diagram of one embodiment of the automatic correcting means of FIG. 6.

Reference is now made to FIG. 7, which shows one possible embodiment of the automatic gain correction feature in an intermediate frequency amplifier which is adapted for use as a receiver for telecontrol signals. The circuit of FIG. 7 is connected directly to the signal output point B in the circuit of FIG. 3, and also to the point A in FIG. 3. The output signal from the amplifier of FIG. 4 is taken at the point B and transmitted, through a series circuit comprising a capacitor C6 and a resistor R16, to the base of a transistor Q4.

The transistor Q4 is polarised by a resistor R12 and a resistor R17 in series with a diode D2. The emitter of the transistor Q4 is connected to ground through a resistor R15 and a parallel circuit consisting of a resistor R16 and a capacitor C10, so as to give partial emitter decoupling.

The collector of the transistor Q4 is connected to the supply terminal 13 at the highest d.c. voltage through a resistor R14, which is in series with a further resistor R13, and a transistor Q5 which is connected as a compensating diode, with its base and collector being short circuited.

In addition, the common point between the resistor R14 and the resistor R13 is connected to the base of a transistor Q3, which is of the PNP type as opposed to the NPN type of the transistor Q4. The emittercollector path of the transistor Q3 is connected between the high d.c. voltage supply 13 and the point A, via a resistor R10 between the supply 13 and the emitter of transistor Q3, and a resistor R11 connected between the collector of transistor Q3 and the point A.

The transistor Q4 operates with a very low current if the values of the resistors R13, R14, R15 and R16 are suitably chosen. In addition, the transistor Q4 is polarised through a resistor R12 and a resistor R17 in series with a temperature compensating diode D2, which may itself also be replaced by a transistor having its base and emitter short circuited.

The output of the circuit is taken on the collector of the transistor Q4 through a capacitor C11. The circuit comprising the resistor R14 and capacitor C11 filters the signal which is detected by the transistor Q4.

The receiver that includes the intermediate frequency amplifier of the kind described in its various embodiments above includes a carrier wave detector such as an antenna, producing the input voltage signal Ve which is applied to the input of the intermediate frequency amplifier. The output of the intermediate frequency stage is connected to a decoder for decoding signals which are transmitted and detected, with its output signals then being processed.

In the context of telecontrol, for example for locking the doors of a vehicle, the locking code is then transmitted to suitable actuators which operate the locks.

What is claimed is:

1. An intermediate frequency amplifier, comprising: a first supply and a second supply arranged to be at high and low potential respectively; a signal input and a signal output; a first amplifying transistor; a second amplifying transistor; means connecting the first transistor and the signal input; means connecting the second transistor with the signal output, each said transistor having a base, a collector and an emitter, the collector and emitter of each said transistor defining a collector-emitter path of that transistor; a pair of matched transformers with a first transformer having a winding connected between the collector-emitter paths of said first and second transistors, and a second transformer having a winding connected, in series with said collector-emitter paths and said winding of the first transformer between said first and second supplies; and biasing means, connected in series, for said first and second transistors, whereby a signal applied to said signal input of the amplifier passes in cascade through the base of the first transistor, the collector of the first transistor, the first transformer, the base of the second transistor, and the collector of the second transistor, to said signal output of the amplifier.

2. An intermediate frequency amplifier according to claim 1, further including a high frequency decoupling capacitor connected between said second supply line and the emitter of said second transistor.

3. An intermediate frequency amplifier according to claim 1, further including a temperature compensating means connected to the base of said first transistor.

4. An intermediate frequency amplifier according to claim 1, further including: an automatic gain correction circuit which comprises level detecting means for detecting the level of the signal at said signal output; adding means having a first input connected to said signal input of the amplifier, a second input, and an output connected to the emitter of said first transistor; a controllable current source having a control electrode and having a third transistor, the collector of which is connected to said second input of the adding means; and level detecting means for detecting the level of the output signal at said signal output of the amplifier and having a fourth transistor connected to said signal output, the collector of said fourth transistor being connected to said control electrode of the controllable current source, whereby to reduce, to a greater or lesser extent, the current in said first transistor and consequently the output voltage of level of said second transistor.

5. A receiver for a telecontrol system having an intermediate frequency amplifier comprising: a first supply and a second supply arranged to be at high and low potential respectively; a signal input and a signal output; a first amplifying transistor; a second amplifying transistor; means connecting the first transistor and the signal input; means connecting the second transistor with the signal output, each said transistor having a base, a collector and an emitter, the collector and emitter of each said transistor defining a collector-emitter path of that transistor; a pair of matched transformers with a first transformer having a winding connected between the collector-emitter paths of said first and second transistors, and a second transformer having a winding connected, in series with said collector-emitter paths and said winding of the first transformer between said first and second supplies; and biasing means, connected in series, for said first and second transistors, whereby a signal applied to said signal input of the amplifier passes in cascade through the base of the first transistor, the collector of the first transistor, the first transformer, the base of the second transistor, and the collector of the second transistor, to said signal output of the amplifier.

* * * * *